(12) United States Patent
Shiraiwa et al.

(10) Patent No.: US 11,862,501 B2
(45) Date of Patent: Jan. 2, 2024

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Norio Shiraiwa, Nagano (JP); Kazuya Takada, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 224 days.

(21) Appl. No.: 17/470,574

(22) Filed: Sep. 9, 2021

(65) Prior Publication Data
US 2022/0084866 A1 Mar. 17, 2022

(30) Foreign Application Priority Data

Sep. 11, 2020 (JP) .................... 2020-152713

(51) Int. Cl.
*H01T 23/00* (2006.01)
*H01L 21/683* (2006.01)
*H01L 21/687* (2006.01)

(52) U.S. Cl.
CPC .... *H01L 21/6833* (2013.01); *H01L 21/68757* (2013.01); *H01L 21/68785* (2013.01)

(58) Field of Classification Search
None
See application file for complete search history.

(56) References Cited

U.S. PATENT DOCUMENTS

| | | | | |
|---|---|---|---|---|
| 5,914,568 A | * | 6/1999 | Nonaka | H01L 21/6831 315/111.41 |
| 6,295,194 B1 | * | 9/2001 | Sun | B82Y 15/00 361/233 |
| 2013/0330509 A1 | * | 12/2013 | Otsubo | B32B 18/00 156/89.12 |
| 2016/0358801 A1 | * | 12/2016 | Minami | C04B 37/025 |
| 2017/0069519 A1 | | 3/2017 | Shiraiwa | |
| 2020/0126837 A1 | * | 4/2020 | Kuno | H01L 21/67109 |

FOREIGN PATENT DOCUMENTS

| | | |
|---|---|---|
| JP | H07-335731 | 12/1995 |
| JP | 2003-051433 | 2/2003 |
| JP | 2017-50468 | 3/2017 |

* cited by examiner

*Primary Examiner* — Stephen W Jackson
(74) *Attorney, Agent, or Firm* — Rankin, Hill & Clark LLP

(57) ABSTRACT

An electrostatic chuck includes a plurality of ceramic substrates each having a step formed at a peripheral edge portion of one surface, the ceramic substrates being arranged adjacent to each other so that the steps face each other, electrodes each embedded in each of the plurality of ceramic substrates, and a filling portion that fills a groove portion formed by the facing steps of the adjacent ceramic substrates.

5 Claims, 9 Drawing Sheets

FIG. 9

| TIME (s) | TEMPERATURE (°C) ||
|---|---|---|
| | CERAMIC SUBSTRATE | SPRAYED PORTION |
| 0 | 26.7 | 26.6 |
| 500 | 42.7 | 42.8 |
| 1000 | 51.7 | 51.4 |
| 1500 | 54.3 | 54.1 |
| 2000 | 54.9 | 54.7 |
| 2500 | 55.4 | 55 |

ELECTROSTATIC CHUCK AND SUBSTRATE FIXING DEVICE

CROSS-REFERENCE TO RELATED APPLICATIONS

This application is based on and claims the benefit of priority from prior Japanese patent application No. 2020-152713 filed on Sep. 11, 2020, the entire contents of which are incorporated herein by reference.

TECHNICAL FIELD

The present invention relates to an electrostatic chuck and a substrate fixing device.

BACKGROUND ART

In the related art, a substrate fixing device having an electrostatic chuck is used so as to fix a wafer in etching processing, for example. The substrate fixing device is constituted by bonding an electrostatic chuck consisting of a ceramic substrate having an electrode embedded therein to a base plate of metal. In general, as an adhesive for bonding the electrostatic chuck to the base plate, a flexible silicone-based adhesive is used so as to favorably maintain thermal conductivity and to absorb a difference of thermal expansions between the base plate and the electrostatic chuck.

The substrate fixing device can adsorb the wafer to the electrostatic chuck by applying a voltage to the electrode embedded in the ceramic substrate of the electrostatic chuck and using an electrostatic force generated according to the voltage. When fixing a relatively large-scale wafer or the like, the substrate fixing device may be constituted by bonding an electrostatic chuck consisting of a plurality of ceramic substrates to the base plate. Specifically, for example, by arranging side by side four ceramic substrates each having a size of 250 mm×250 mm and bonding the ceramic substrates to a base plate, a substrate fixing device having an electrostatic chuck of 500 mm×500 mm is constituted to adsorb a large-scale wafer.

CITATION LIST

Patent Literature

Patent Literature 1: JP-A-2003-051433
Patent Literature 1: JP-A-2017-050468
Patent Literature 3: JP-A-H07-335731

SUMMARY OF INVENTION

However, when bonding the electrostatic chuck consisting of the plurality of ceramic substrates to the base plate, the adhesive is attached between the adjacent ceramic substrates, so that components of the adhesive seep to a surface of the ceramic substrate. Specifically, when the electrostatic chuck consisting of the plurality of ceramic substrates is bonded to the base plate by a silicone resin-based adhesive (hereinafter, referred to as 'silicone adhesive'), the silicone adhesive is also introduced between the adjacent ceramic substrates. When the substrate fixing device is used in such a state, silicone oil included in the silicone adhesive seeps to surfaces of the ceramic substrates, which are adsorption surfaces, so that a smudge is generated near a boundary of the adjacent ceramic substrates. As a result, the smudge is transferred to an adsorption object such as a wafer adsorbed to the electrostatic chuck, so that the adsorption object is defaced, in some cases.

Therefore, it is also considered to bond the plurality of ceramic substrates with being spaced on the base plate and to remove the adhesive between the adjacent ceramic substrates. However, when the plurality of ceramic substrates is arranged with being spaced, a temperature of the adsorption surface of the electrostatic chuck is not uniform, so that heat-equalizing performance of keeping a temperature of the entire adsorption object uniform is impaired.

Aspect of non-limiting embodiments of the present disclosure is to provide an electrostatic chuck and a substrate fixing device capable of preventing an adsorption object from being defaced without impairing heat-equalizing performance.

According to an aspect of the present disclosure, there is provided an electrostatic chuck comprising:
a plurality of ceramic substrates each having a step formed at a peripheral edge portion of one surface, the ceramic substrates being arranged adjacent to each other so that the steps face each other;
electrodes each embedded in each of the plurality of ceramic substrates; and
a filling portion that fills a groove portion formed by the facing steps of the adjacent ceramic substrates.

According to one aspect of the electrostatic chuck and the substrate fixing device of the present disclosure, it is possible to prevent the adsorption object from being defaced without impairing heat-equalizing performance.

BRIEF DESCRIPTION OF DRAWINGS

FIG. 9 shows an example of change in temperature of an electrostatic chuck.

DESCRIPTION OF EMBODIMENTS

Hereinafter, one embodiment of an electrostatic chuck, a substrate fixing device and a manufacturing method of a substrate fixing device of the present disclosure will be described in detail with reference to the drawings. Note that, the present invention is not limited to the embodiment.

Figure 1:
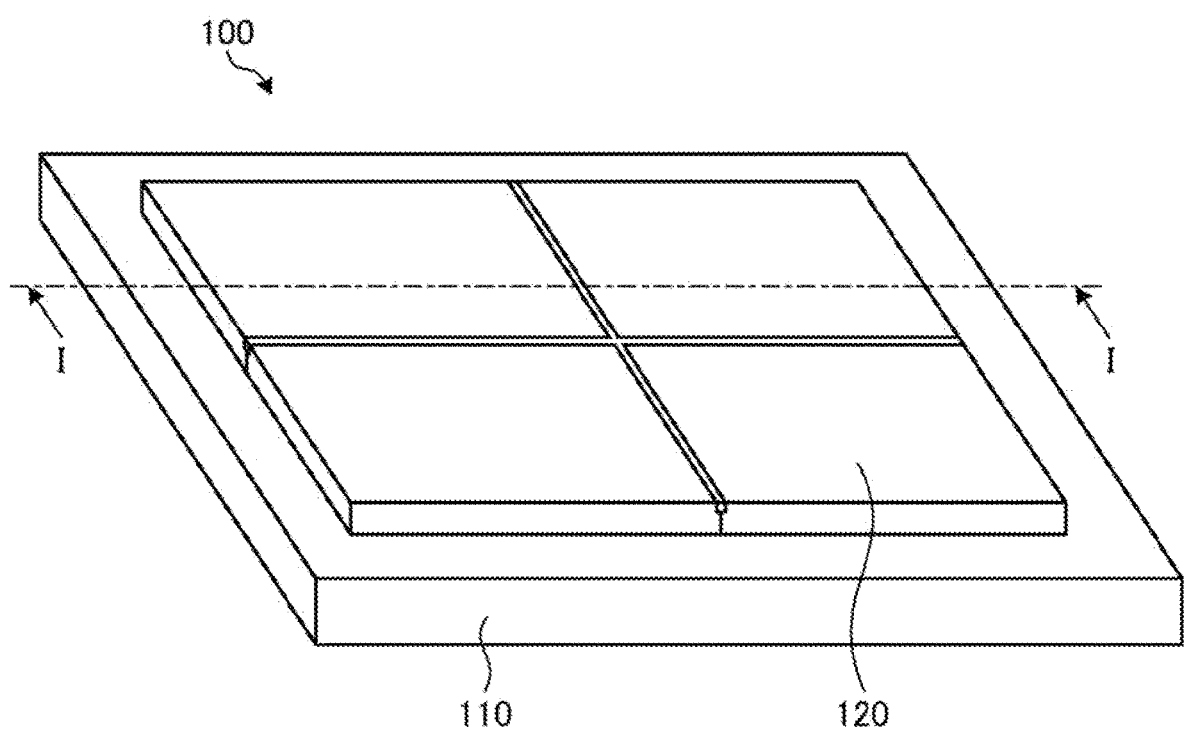
FIG. 1 is a perspective view showing a configuration of a substrate fixing device according to an embodiment.

FIG. 1 is a perspective view showing a configuration of a substrate fixing device 100 according to an embodiment. The substrate fixing device 100 shown in FIG. 1 has a structure where an electrostatic chuck 120 is bonded to a base plate 110.

The base plate 110 is a square member of metal such as aluminum, for example. The base plate 110 is abase member for fixing the electrostatic chuck 120. The base plate 110 is attached to a semiconductor manufacturing device, for example, and causes the substrate fixing device 100 to function as a semiconductor holding device configured to hold a wafer.

The electrostatic chuck 120 has a plurality of (four, in FIG. 1) ceramic substrates aligned side by side, and is configured to adsorb an adsorption object such as a wafer to surfaces of the ceramic substrates by using an electrostatic force. The electrostatic chuck 120 is bonded to the base plate 110 by a silicone adhesive, for example. The plurality of ceramic substrates constituting the electrostatic chuck 120 is arranged adjacent to each other, and a sprayed portion is formed at a boundary of the adjacent ceramic substrates by spraying aluminum oxide (alumina).

Figure 2:
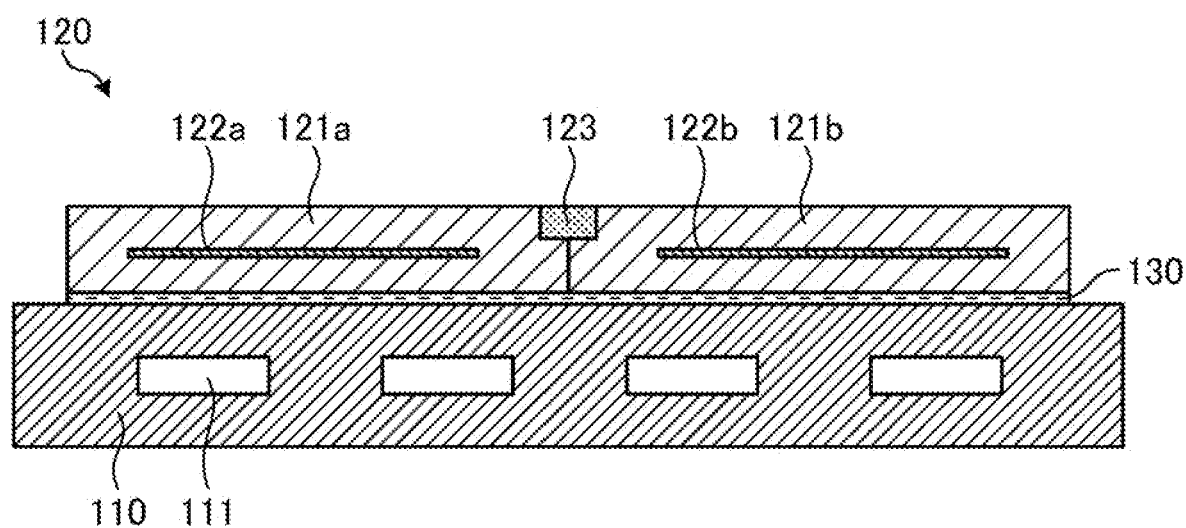
FIG. 2 is a schematic view showing a section of the substrate fixing device according to the embodiment.

FIG. 2 is a schematic view showing a section taken along an I-I line of FIG. 1. As shown in FIG. 2, the substrate fixing device 100 is constituted by bonding the electrostatic chuck 120 to the base plate 110 via an adhesive layer 130.

The base plate 110 is a metal member having a thickness of about 20 to 50 mm where a cooling water channel 111 becoming a flow path of cooling water is formed therein. The base plate 110 is configured to cool the electrostatic chuck 120 by cooling water introduced from an outside of the substrate fixing device 100 into the cooling water channel 111. The electrostatic chuck 120 is cooled, so that the adsorption object such as a wafer adsorbed to the electrostatic chuck 120 is cooled.

Note that, the base plate 110 may have a cooling gas channel becoming a flow path of a cooling gas, instead of the cooling water channel 111. For example, the base plate 110 may have a coolant passage through which a coolant such as cooling water and cooling gas passes.

Also, the base plate 110 may be integrated with a heater configured to heat the electrostatic chuck 120 by a heat-generating electrode. Thereby, the base plate 110 can control a temperature of the electrostatic chuck 120 by heating from the heater and cooling from the coolant passage and can heat the adsorption object adsorbed to the electrostatic chuck 120 to a desired temperature.

The electrostatic chuck 120 has a plurality of ceramic substrates including ceramic substrates 121a and 121b, and a sprayed portion 123. In each of the ceramic substrates 121a and 121b, electrodes 122a and 122b are each embedded.

The ceramic substrates 121a and 121b are each formed by firing a green sheet prepared using aluminum oxide, for example. At this time, by stacking and firing the green sheet and the electrodes 122a and 122b, the ceramic substrates 121a and 121b having the electrodes 122a and 122b embedded therein are formed. A thickness of each of the ceramic substrates 121a and 121b is, for example, about 3 to 7 mm, and preferably 4 to 5 mm.

The ceramic substrates 121a and 121b are bonded to the base plate 110 with being adjacent to each other. Specifically, lower surfaces of the ceramic substrates 121a and 121b are bonded to an upper surface of the base plate 110 by the adhesive layer 130. A peripheral edge portion of an upper surface of each of the ceramic substrates 121a and 121b is formed with a step, and the steps of the ceramic substrates 121a and 121b face each other to form a groove portion at a boundary portion of the ceramic substrates 121a and 121b. In the groove portion, the sprayed portion 123 is formed.

The electrodes 122a and 122b are each embedded in each of the ceramic substrates 121a and 121b, and generate an electrostatic force when a voltage is applied, thereby adsorbing the adsorption object to the upper surfaces of the ceramic substrates 121a and 121b. The electrodes 122a and 122b of the ceramic substrates 121a and 121b are single electrodes with the same polarity. Thereby, for example, it is possible to adsorb an insulating substrate such as a glass substrate. However, the electrodes 122a and 122b of the adjacent ceramic substrates 121a and 121b may also be configured as dipole electrodes with different polarities.

The sprayed portion 123 is formed by spraying aluminum oxide (alumina), for example, into the groove portion formed by the facing steps of the peripheral edge portions of the upper surfaces of the ceramic substrates 121a and 121b. The sprayed portion 123 may also be formed by spraying yttrium oxide (yttria), for example, instead of alumina. In a case where the ceramic substrates 121a and 121b are formed of oxide or nitride other than alumina, the sprayed portion 123 may also be formed by spraying the same oxide or nitride as the material of the ceramic substrates 121a and 121b.

Since the groove portion in which the sprayed portion 123 is formed has a sectional shape where a depth from the upper surfaces of the ceramic substrates 121a and 121b is 0.2 to 1 mm and a width is 1 to 2 mm, the sprayed portion 123 also has a sectional shape where a thickness is 0.2 to 1 mm and a width is 1 to 2 mm. Since side ends of the electrodes 122a and 122b are positioned on an inner side spaced by 1 to 2 mm from side surfaces of the ceramic substrates 121a and 121b, the sprayed portion 123 and the electrodes 122a and 122b do not overlap each other, as seen from above. Since upper surfaces of the electrodes 122a and 122b are positioned at a depth spaced by 0.6 to 1.5 mm from the upper surfaces of the ceramic substrates 121a and 121b, the sprayed portion 123 and the electrodes 122a and 122b do not overlap each other, as seen from side.

The sprayed portion 123 seals the upper of the adjacent side surfaces of the ceramic substrates 121a and 121b, thereby preventing components of the adhesive from seeping from the adhesive layer 130 to the upper surfaces of the ceramic substrates 121a and 121b. Specifically, the sprayed portion 123 prevents components of the adhesive from seeping to the adsorption surface of the electrostatic chuck 120, thereby preventing the adsorption object adsorbed on the adsorption surface from being defaced.

The adhesive layer 130 is a layer of a silicone resin-based adhesive (silicone adhesive), and bonds the lower surface of the electrostatic chuck 120 to the upper surface of the base plate 110. Specifically, the adhesive layer 130 bonds the lower surfaces of the plurality of ceramic substrates including the ceramic substrates 121a and 121b to the upper surface of the base plate 110. The silicone adhesive that forms the adhesive layer 130 is also attached to the facing side surfaces of the adjacent ceramic substrates 121a and 121b. However, since the sprayed portion 123 is formed above the facing side surfaces of the adjacent ceramic substrates 121a and 121b, the components of the adhesive do not seep from the adhesive attached to the facing side surfaces of the ceramic substrates 121a and 121b to the upper surfaces of the ceramic substrates 121a and 121b.

Figure 3:
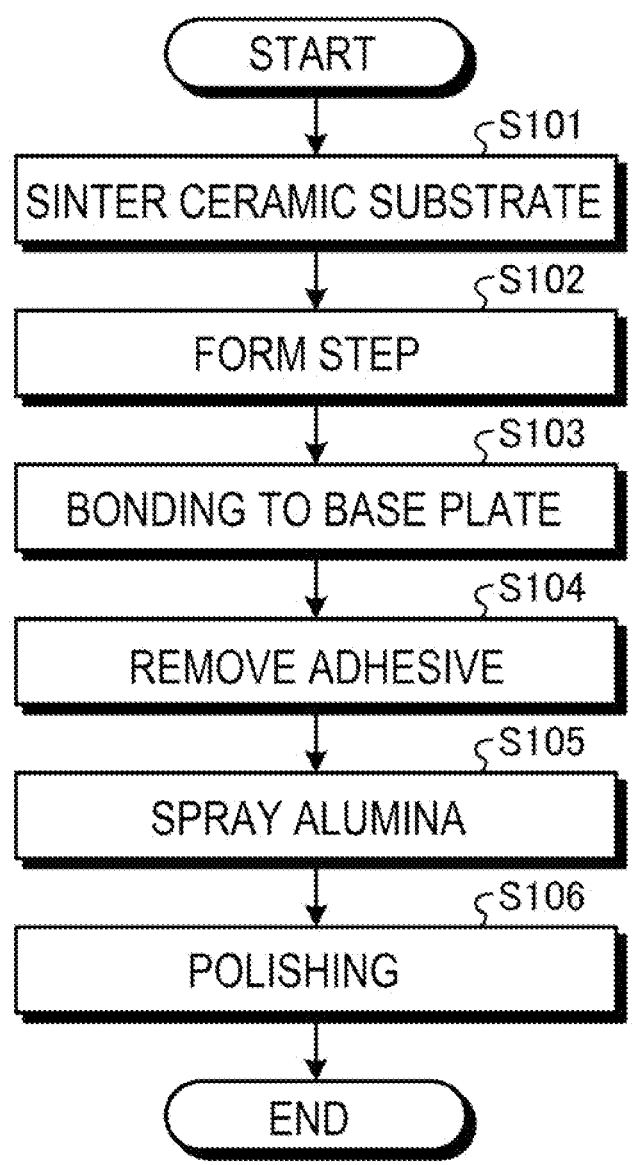
FIG. 3 is a flowchart showing a manufacturing method of a substrate fixing device according to the embodiment.

Subsequently, a manufacturing method of the substrate fixing device 100 configured as described above is described with reference to a flowchart shown in FIG. 3.

First, a plurality of ceramic substrates 121 that constitutes the electrostatic chuck 120 is prepared (step S101). Specifically, a plurality of green sheets where aluminum oxide is a main material is prepared, and an electrode 122 is formed on one surface of the green sheet. The electrode 122 may also be formed by screen printing a metal paste on the surface of the green sheet, for example. Then, the plurality of green sheets is stacked and sintered to prepare the ceramic substrate 121.

Figure 4:
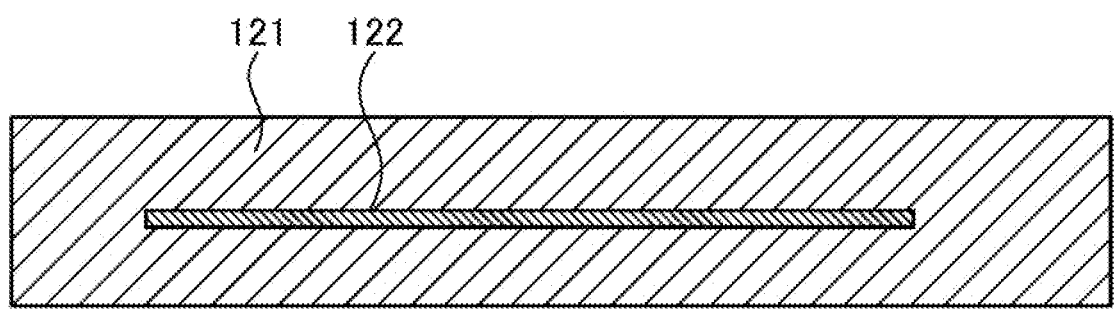
FIG. 4 shows an example of a ceramic substrate.

The ceramic substrate 121 has a layer of the electrode 122 formed therein, as shown in FIG. 4, for example. A thickness of the ceramic substrate 121 is, for example, about 3 to 7 mm, and preferably 4 to 5 mm. The electrode 122 is formed at a depth of 0.8 to 1.7 mm from the upper surface of the ceramic substrate 121, for example. In a polishing process to be described later, since the upper surface of the ceramic substrate 121 is polished together with the sprayed portion 123, the electrode 122 shown in FIG. 4 is formed at a deeper position from the upper surface of the ceramic substrate 121 than the electrode 122 upon completion of the substrate fixing device 100. Also, the side end of the electrode 122 is positioned on an inner side of 1 to 2 mm from the side surface of the ceramic substrate 121, for example.

Figure 5:
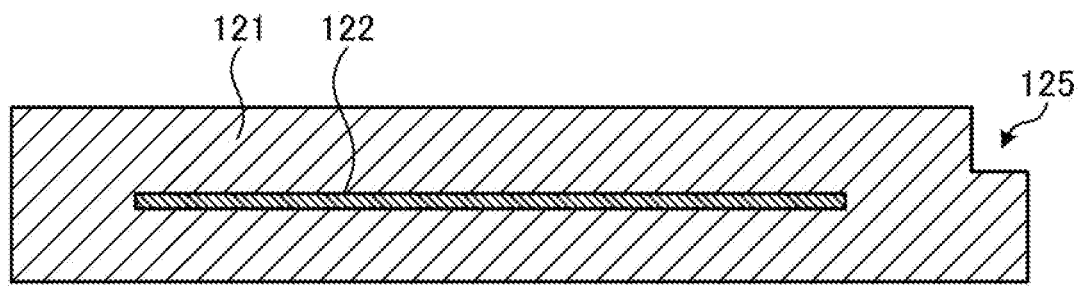
FIG. 5 shows an example of a step forming process.

When the plurality of (for example, four) ceramic substrates 121 is prepared, a step is formed at a peripheral edge portion of one surface of each of the ceramic substrates 121 (step S102). Specifically, for example, as shown in FIG. 5, one side of the upper surface of the ceramic substrate 121 is formed with a step 125 having a dimension that does not overlap the electrode 122, as seen from above and side. Specifically, a depth of the step 125 is, for example, 0.4 to 1.2 mm, and a width of a bottom surface of the step 125 is, for example, 0.5 to 1 mm. The step 125 is formed above a side surface of the ceramic substrate 121, which is adjacent to another ceramic substrate 121 when the ceramic substrate 121 is bonded to the base plate 110. Therefore, for example, when two side surfaces of the ceramic substrate 121 are adjacent to other ceramic substrates 121, the step 125 is each formed above the two side surfaces.

Figure 6:
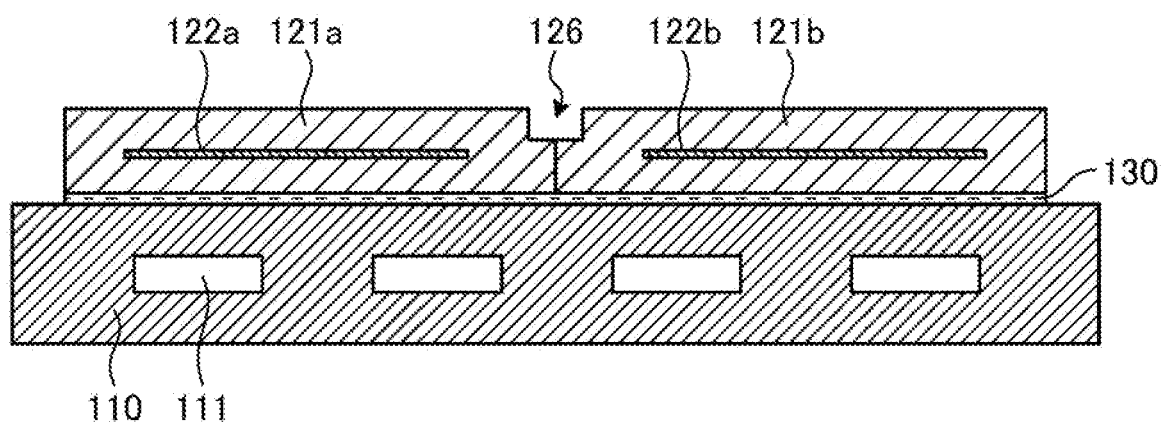
FIG. 6 shows an example of a bonding process.

The plurality of ceramic substrates 121 each having the step 125 is bonded to the base plate 110 by the silicone adhesive (step S103). Specifically, for example, as shown in FIG. 6, the ceramic substrates 121*a* and 121*b* are bonded with being aligned side by side on the upper surface of the base plate 110 by the silicone adhesive. The silicone adhesive that is used for bonding forms the adhesive layer 130 between the base plate 110 and the ceramic substrates 121*a* and 121*b*.

The adjacent ceramic substrates 121*a* and 121*b* are arranged so that the steps 125 formed at the peripheral edge portions of the upper surfaces thereof face each other, and are bonded to the base plate 110, and the groove portion 126 is formed by the facing steps 125 of the ceramic substrates 121*a* and 121*b*. Specifically, in the state where the plurality of ceramic substrates 121 is bonded to the base plate 110, the groove portion 126 is formed at the boundary portion of the adjacent ceramic substrates 121. Since the groove portion is formed by the facing steps 125, a depth thereof is, for example, 0.4 to 1.2 mm, which is the same as the step 125, and a width of a bottom surface is two times as large as the step 125, for example, 1 to 2 mm.

When the plurality of ceramic substrates 121 is bonded to the base plate 110, the silicone adhesive leaked from the adhesive layer 130 to the bottom surface of the groove portion 126 is removed (step S104). Specifically, when the ceramic substrates 121 are bonded to the base plate 110, some of the silicone adhesive is attached to the side surfaces of the ceramic substrates 121 and is pressed by the side surfaces of the adjacent ceramic substrates 121, so that it is leaked to the bottom surface of the groove portion 126. The silicone adhesive leaked to the bottom surface of the groove portion 126 is removed. At the same time, the silicone adhesive leaked from the lower surfaces of the ceramic substrates 121 to the outer peripheral portion of the upper surface of the base plate 110 is also removed.

Figure 7:
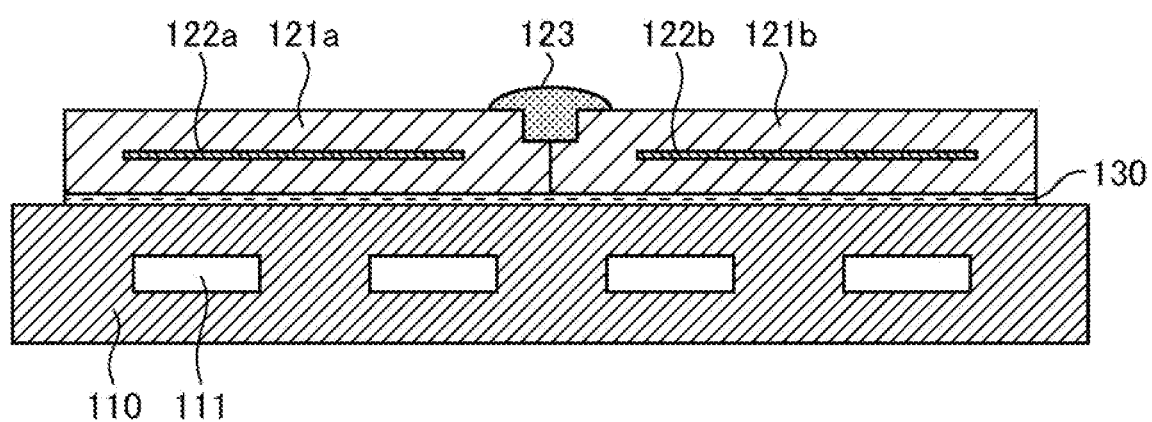
FIG. 7 shows an example of an alumina spraying process.

Then, alumina praying of spraying melted alumina particles into the groove portion 126 is performed (step S105). Specifically, melted and softened alumina particles are sprayed into the groove portion 126 and cooled and solidified, so that the sprayed portion 123 is formed as shown in FIG. 7. The sprayed portion 123 seals the boundary portion of the adjacent ceramic substrates 121*a* and 121*b* in the vicinity of the upper surfaces of the ceramic substrates 121*a* and 121*b*. For this reason, the sprayed portion 123 prevents components of the silicone adhesive attached to the side surfaces of the ceramic substrates 121*a* and 121*b* from seeping to the upper surfaces of the ceramic substrates 121*a* and 121*b*.

Note that, the material to be sprayed is not limited to alumina. For example, when yttria is sprayed to form the sprayed portion 123, a plasma resistance of the sprayed portion 123 can be improved. Specifically, in a case where the substrate fixing device 100 is used for plasma etching of a wafer, for example, the ceramic substrates 121 and the sprayed portion 123 are exposed to the plasma. When the sprayed portion 123 is formed by spraying yttria, corrosion of the sprayed portion 123 due to the plasma can be suppressed. In addition, in a case where the ceramic substrates 121 are formed of oxide or nitride other than alumina, the sprayed portion 123 may also be formed by spraying the same oxide or nitride as the material of the ceramic substrates 121. In this way, it is possible to reduce a temperature difference between the ceramic substrates 121 and the sprayed portion 123, and to suppress lowering in heat-equalizing performance of the electrostatic chuck 120 having the ceramic substrates 121 and the sprayed portion 123.

Figure 8:
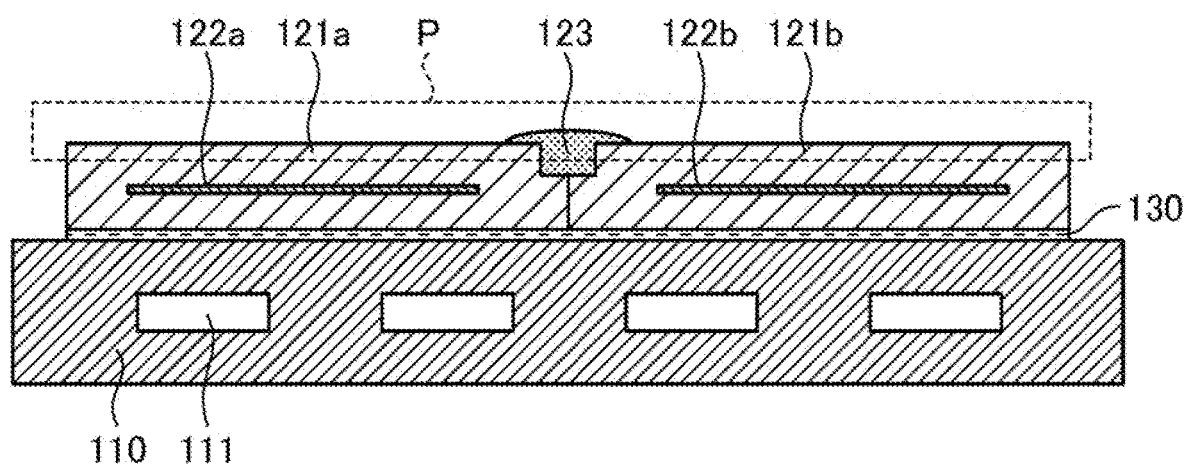
FIG. 8 shows an example of a polishing process.

After performing the alumina spraying, the surface of the sprayed portion 123 is polished together with the upper surfaces of the ceramic substrates 121 (step S106). Specifically, for example, as shown in FIG. 8, a portion P having a thickness of, for example, 0.2 mm from the upper surfaces of the ceramic substrates 121*a* and 121*b* is polished, so that the upper surface of the sprayed portion 123 becomes flush with the upper surfaces of the ceramic substrates 121*a* and 121*b*. Specifically, the upper surfaces of the plurality of ceramic substrates 121 and the upper surface of the sprayed portion 123 are flush with each other, so that the adsorption surface of the electrostatic chuck 120 becomes a continuous planar surface. Since the upper portion of the sprayed portion 123 is polished together with the upper parts of the ceramic substrates 121, a thickness of the sprayed portion 123 after the polishing becomes, for example, 0.2 to 1 mm.

Then, as required, embossing processing is performed or a groove is formed on the adsorption surface of the electrostatic chuck 120 (i.e., the upper surfaces of the ceramic substrates 121 and the sprayed portion 123), so that the substrate fixing device 100 having the electrostatic chuck 120 is completed. Since the substrate fixing device 100 has the electrostatic chuck 120 where the plurality of ceramic substrates 121 are aligned side by side, the substrate fixing device can adsorb and fix a relatively large-scale adsorption object. In addition, the sprayed portion 123 is formed at the boundary of the plurality of ceramic substrates 121, so that the components of the silicone adhesive bonding the ceramic substrates 121 to the base plate 110 do not seep to the adsorption surface of the electrostatic chuck 120. As a result, a smudge is prevented from being generated on the adsorption surface of the electrostatic chuck 120, so that the adsorption object can be prevented from being defaced.

Further, since the sprayed portion 123 is formed at the boundary of the plurality of ceramic substrates that constitutes the electrostatic chuck 120, the temperature of the adsorption surface of the electrostatic chuck 120 can be made uniform, so that lowering in the heat-equalizing performance can be prevented. Specifically, when the substrate fixing device 100 having the sprayed portion 123 formed by the alumina spraying is placed on a hot plate of 60° C., a specific example of changes in temperature of the ceramic substrates 121 and the sprayed portion 123 is shown in FIG. 9.

As shown in FIG. 9, the temperature difference between the ceramic substrate 121 and the sprayed portion 123 for each elapsed time after the substrate fixing device 100 is mounted on the hot plate of 60° C. is within a range of 0.1 to 0.4° C. Specifically, the temperature difference between the ceramic substrates 121 and the sprayed portion 123 constituting the electrostatic chuck 120 is small, and the temperature of the adsorption surface is uniform. For this reason, it is possible to equally heat the adsorption object adsorbed on the adsorption surface, so that it is possible to suppress lowering in heat-equalizing performance.

As described above, according to the present embodiment, for the electrostatic chuck where the plurality of ceramic substrates is formed aligned side by side, the sprayed portion is formed by spraying alumina to the boundary of the adjacent ceramic substrates. For this reason, the boundary of the adjacent ceramic substrates on the adsorption surface of the electrostatic chuck is sealed, so that when the electrostatic chuck is bonded to the base plate by the silicone adhesive, the components of the silicone adhesive do not seep to the adsorption surface of the electrostatic chuck and the defacement of the adsorption object can be prevented. In addition, since the ceramic substrates and the sprayed portion constitute the adsorption surface of the electrostatic chuck, the temperature of the adsorption surface becomes uniform, so that lowering in heat-equalizing performance can be suppressed. In other words, it is possible to prevent defacement of the adsorption object without lowering the heat-equalizing performance.

In the above embodiment, the sprayed portion 123 is formed at the boundary of the adjacent ceramic substrates 121. However, the boundary of the ceramic substrates 121 may also be filled by PVD (Physical Vapor Deposition) or resin filling, instead of the spraying. Specifically, the boundary of the adjacent ceramic substrates 121 may be filled with, for example, yttrium oxide by PVD or may be filled with epoxy resin. In this way, the filled portion is formed at the boundary of the adjacent ceramic substrates 121 by the spraying, PVD or resin filling, so that the components of the silicone adhesive do not seep to the adsorption surface of the electrostatic chuck 120, and therefore, the defacement of the adsorption object can be prevented.

Further, in the embodiment, the square ceramic substrates 121 are arranged side by side, so that the electrostatic chuck 120 having a square adsorption surface is constituted. However, the shape of the electrostatic chuck 120 is not limited thereto. Specifically, fan-shaped ceramic substrates may be arranged side by side to constitute an electrostatic chuck having a circular adsorption surface. Also in this case, a peripheral edge portion corresponding to a radius of the fan shape of each ceramic substrate is formed with a step, and a groove portion formed by the facing steps of the adjacent ceramic substrates can be formed with a sprayed portion by alumina spraying, for example.

This disclosure further encompasses various exemplary embodiments, for example, described below.

[1] A manufacturing method of a substrate fixing device, the manufacturing method comprising:

arranging side by side a plurality of ceramic substrates, each of which having a step formed at a peripheral edge portion of one surface and an electrode embedded therein, on a base plate so that the steps face each other; and filling a groove portion formed by the facing steps of the adjacent ceramic substrates.

[2] The manufacturing method according to [1], wherein the filling comprises spraying oxide or nitride into the groove portion.

[3] The manufacturing method according to [2], further comprising:

polishing a surface of a sprayed portion formed by the spraying and one surface of each of the plurality of ceramic substrates.

What is claimed is:

1. An electrostatic chuck comprising:
a plurality of ceramic substrates each having a step formed at a peripheral edge portion of one surface, the ceramic substrates being arranged adjacent to each other so that the steps face each other;
electrodes each embedded in each of the plurality of ceramic substrates; and
a filling portion that fills a groove portion formed by the facing steps of the adjacent ceramic substrates,
wherein the filling portion is formed in a position in which it does not overlap the electrodes, as seen from above and side.

2. The electrostatic chuck according to claim 1, wherein the filling portion is formed by spraying oxide or nitride into the groove portion.

3. The electrostatic chuck according to claim 1, wherein the plurality of ceramic substrates is each a ceramic substrate formed of aluminum oxide, and
wherein the filling portion is formed by spraying aluminum oxide.

4. The electrostatic chuck according to claim 1, wherein the filling portion is formed by spraying yttrium oxide.

5. A substrate fixing device comprising:
a base plate;
a plurality of ceramic substrates each having a step formed at a peripheral edge portion of one surface, the ceramic substrates being arranged adjacent to each other on the base plate so that the steps face each other and being bonded to the base plate by using an adhesive;
electrodes each embedded in each of the plurality of ceramic substrates; and
a filling portion that fills a groove portion formed by the facing steps of the adjacent ceramic substrates,
wherein the filling portion is formed in a position in which it does not overlap the electrodes, as seen from above and side.

* * * * *